(12) United States Patent
Yao et al.

(10) Patent No.: US 11,527,703 B2
(45) Date of Patent: Dec. 13, 2022

(54) MULTI-LAYERED PIEZOELECTRIC CERAMIC-CONTAINING STRUCTURE

(71) Applicant: AGENCY FOR SCIENCE, TECHNOLOGY AND RESEARCH, Singapore (SG)

(72) Inventors: Kui Yao, Singapore (SG); Chee Kiang Ivan Tan, Singapore (SG); Shuting Chen, Singapore (SG); Shifeng Guo, Singapore (CN); Lei Zhang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 303 days.

(21) Appl. No.: 16/769,120

(22) PCT Filed: Dec. 4, 2018

(86) PCT No.: PCT/SG2018/050592
§ 371 (c)(1),
(2) Date: Jun. 2, 2020

(87) PCT Pub. No.: WO2019/112518
PCT Pub. Date: Jun. 13, 2019

(65) Prior Publication Data
US 2020/0388747 A1     Dec. 10, 2020

(30) Foreign Application Priority Data
Dec. 6, 2017   (SG) .......................... 10201710100V

(51) Int. Cl.
*H01L 41/08*     (2006.01)
*H01L 41/083*    (2006.01)
(Continued)

(52) U.S. Cl.
CPC ........ *H01L 41/083* (2013.01); *H01L 41/0815* (2013.01); *H01L 41/0986* (2013.01);
(Continued)

(58) Field of Classification Search
None
See application file for complete search history.

(56) References Cited

U.S. PATENT DOCUMENTS

2005/0287386 A1    12/2005  Sabol et al.
2015/0044444 A1*    2/2015  Gell ........................ C23C 4/10
                                                        415/230

(Continued)

FOREIGN PATENT DOCUMENTS

JP      2010118447 A    5/2010

OTHER PUBLICATIONS

International Preliminary Report on Patentability for International Application No. PCT/SG2018/050592 dated Jun. 9, 2020, 8 pages.
(Continued)

*Primary Examiner* — Benjamin P Sandvik
(74) *Attorney, Agent, or Firm* — Harness, Dickey & Pierce, P.L.C.

(57) ABSTRACT

A multi-layered piezoelectric ceramic-containing structure There is provided a multi-layered piezoelectric ceramic-containing structure comprising: a metal substrate; a metallic adhesive layer on a surface of the metal substrate; a non-metallic thermal barrier layer on the metallic adhesive layer; and a piezoelectric ceramic layer sandwiched between a first electrode layer and a second electrode layer, wherein the first electrode layer is on the non-metallic thermal barrier layer. There is also provided a method of forming the structure.

20 Claims, 6 Drawing Sheets

(51) Int. Cl.
- *H01L 41/09* (2006.01)
- *H01L 41/187* (2006.01)
- *H01L 41/27* (2013.01)
- *H01L 41/316* (2013.01)
- *H01L 41/319* (2013.01)

(52) U.S. Cl.
CPC .......... *H01L 41/1873* (2013.01); *H01L 41/27* (2013.01); *H01L 41/316* (2013.01); *H01L 41/319* (2013.01)

(56) References Cited

U.S. PATENT DOCUMENTS

| | | |
|---|---|---|
| 2016/0133826 A1 | 5/2016 | Yao et al. |
| 2017/0186936 A1* | 6/2017 | Fujii .................. H01L 41/0815 |

OTHER PUBLICATIONS

Derniaux, E. et al., "Effects of TiOx physical vapor deposition parameters on the preferred orientation and adhesion of Pt films on γ-Al2O3", Journal of Vacuum Science and Technology A, Jun. 23, 2006, vol. 24, No. 4, pp. 1540-1545 [Retrieved on Feb. 7, 2019] <DOI: 10.1116/1.2194925>.

Chen, S. et al., "Potassium sodium niobate (KNN)-based lead-free piezoelectric ceramic coatings on steel structure by thermal spray method", Journal of the American Ceramic Society, Jun. 4, 2018, vol. 101, No. 12, pp. 5524-5533 [Retrieved on Feb. 7, 2019] <DOI: 10.1111/JACE.15820>.

International Search Report and Written Opinion of the International Searching Authority issued in PCT/SG2018/050592, dated Feb. 8, 2019; ISA/SG.

* cited by examiner

MULTI-LAYERED PIEZOELECTRIC CERAMIC-CONTAINING STRUCTURE

CROSS REFERENCE TO RELATED APPLICATIONS

This application is a U.S. National Application under 35 U.S.C. 371 of International Application No. PCT/SG2018/050592 filed on Dec. 4, 2018, which claims the benefit of priority from Singapore Patent Application No. 10201710100V filed Dec. 6, 2017. The entire disclosures of all of the above applications are incorporated herein by reference.

TECHNICAL FIELD

The present invention relates to a multi-layered piezoelectric ceramic-containing structure and a method of forming the same.

BACKGROUND

Piezoelectric ceramic layers or coatings on metal are highly demanded to form ultrasonic sensors and transducers directly integrated on various metallic structures, such as for effective structural health monitoring (SHM) purpose for aerospace and marine offshore industry. The ultrasonic sensors and transducers based on piezoelectric coatings offer the advantages of lower cost, reduced weight/profile, and improved consistency, compared to the conventional technology of using handheld ultrasonic transducers or manually installing discrete devices.

Piezoelectric ceramic coatings, particularly lead-free piezoelectric oxide ceramic coatings are typically fabricated on non-metallic inorganic substrates, which can sustain the high processing temperature in oxidation atmosphere as required to process the piezoelectric oxide ceramic layer. For examples, KNN-based thin-film coatings are fabricated on silicon substrate by aerosol deposition and chemical solution deposition. Alternatively, KNN thin-film coatings deposited on steel substrate may be sputtered in a vacuum chamber, with an intermediate layer of $SiO_2$ between a steel substrate and an electrode. However, the thickness of the KNN coating is only a few micrometers, and it is not practical to produce KNN thick-film coatings of 20 µm or above by sputtering in vacuum due to the very low deposition rate.

Piezoelectric coatings with larger thickness of 20 µm and above and large area possess significant advantages in the application of ultrasonic sensors and transducers, including generation of larger electrical output as sensors and larger actuation force or displacement as actuators. KNN piezoelectric thick-film coatings have been produced on alumina substrate by thermal spray of molten ceramic powder as described in US 2016/0133826. High temperature heat treatment of about 1000° C. or even higher in air is typically required for fully crystallizing and/or densifying the piezoelectric thick-film oxide ceramic coating. However, metal substrates tend to be significantly oxidized in the thermal treatment, resulting in structural defects such as poor adhesion and delamination, and degraded performance property.

Thus, there is a need for an improved structure comprising a thick coating of a piezoelectric ceramic material on a metal substrate and a method of preparing the same.

SUMMARY OF THE INVENTION

The present invention seeks to address these problems, and/or to provide a multi-layered piezoelectric ceramic-containing structure, particularly one which has been formed on a metallic substrate. The present invention also provides a method of forming the multi-layered piezoelectric ceramic-containing structure.

In general terms, the invention relates to a piezoelectric composition integrated on a metallic structure, suitable for large area applications. The invention also relates to a high throughput fabrication method to form the multi-layered structures.

According to a first aspect, the present invention provides a multi-layered piezoelectric ceramic-containing structure comprising:
    a metal substrate;
    a metallic adhesive layer on a surface of the metal substrate;
    a non-metallic thermal barrier layer on the metallic adhesive layer; and
    a piezoelectric ceramic layer sandwiched between a first electrode layer and a second electrode layer, wherein the first electrode layer is on the non-metallic thermal barrier layer.

According to a particular aspect, the piezoelectric ceramic layer may be a lead-free piezoelectric ceramic layer. For example, the piezoelectric ceramic layer may be a sodium potassium niobate-based or bismuth sodium titanate-based layer.

According to a particular aspect, the piezoelectric ceramic layer may have an effective piezoelectric coefficient ($d_{33}$) of 50-130 pm/V.

The substrate may be any suitable metal substrate. According to a particular aspect, the substrate may comprise a base metal. In particular, the substrate may be steel.

The metallic adhesive layer may comprise a metal. In particular, the metallic adhesive layer may comprise a NiCrAlY alloy.

The non-metallic thermal barrier layer may comprise an inorganic oxide. In particular, the non-metallic thermal barrier layer may comprise yttria-stabilised zirconia (YSZ).

Each of the layers may have a suitable thickness. According to a particular aspect, the piezoelectric ceramic layer may have a thickness of ≥20 µm. In particular, the piezoelectric ceramic layer may have a thickness of 50-300 µm.

According to a particular aspect, each of the metallic adhesive layer and the non-metallic thermal barrier layer may have a thickness of ≥20 µm. In particular, the metallic adhesive layer may have a thickness of 50-150 µm. In particular, the non-metallic thermal barrier layer may have a thickness of 100-500 µm.

Each of the first electrode layer and the second electrode layer may have a thickness of ≥2 µm. In particular, the first electrode layer may have a thickness of 5-30 µm.

The layers may be formed by any suitable method. For example, the piezoelectric ceramic layer may be formed by thermal spraying. The metallic adhesive layer and the non-metallic thermal barrier layer may be formed by thermal spraying. For example, the thermal spraying may comprise, but is not limited to: atmospheric plasma spraying (APS), low pressure plasma spraying (LPPS), vacuum plasma spraying (VPS), high velocity oxygen fuel (HVOF), or a combination thereof.

According to a second aspect, the present invention provides a method of forming the multi-layered piezoelectric ceramic-containing structure according to the first aspect, the method comprising:
    providing a metal substrate;
    depositing a metallic adhesive layer on a surface of the metal substrate;

depositing a non-metallic thermal barrier layer on the metallic adhesive layer;

depositing a first electrode layer on the non-metallic thermal barrier layer;

depositing a piezoelectric ceramic layer on the first electrode layer; and depositing a second electrode layer on the piezoelectric ceramic layer.

According to a particular aspect, the depositing a metallic adhesive layer, the depositing a non-metallic thermal barrier layer and the depositing a piezoelectric ceramic layer may comprise thermal spraying.

The method may further comprise heat treating the first electrode layer at a pre-determined temperature prior to the depositing a piezoelectric ceramic layer. According to a particular aspect, the pre-determined temperature may be 950-1100° C.

The method may further comprise heat treating the piezoelectric ceramic layer at a pre-determined temperature prior to the depositing a second electrode layer. According to a particular aspect, the pre-determined temperature may be 950-1100° C. The heat treating may be by any suitable means. In particular, the heat treating may comprise heat treating the piezoelectric ceramic layer with a flame at the pre-determined temperature.

BRIEF DESCRIPTION OF THE DRAWINGS

In order that the invention may be fully understood and readily put into practical effect there shall now be described by way of non-limitative example only exemplary embodiments, the description being with reference to the accompanying illustrative drawings. In the drawings.

DETAILED DESCRIPTION

As explained above, there is a need for an improved multilayer structure with a piezoelectric ceramic thick-film layer coated on a metal substrate, and a method of forming the same.

In general terms, the present invention provides a multi-layered structure on a metal substrate which demonstrates good adhesion between layers, and comprising a piezoelectric ceramic thick coating with single phase of perovskite structure, and a strong piezoelectric response. Further, the multi-layered structure is formed by a method which overcomes the problems associated with oxidation of the metal during deposition of the piezoelectric composition on the metal substrate, as well as structures with structural defects such as cracks and poor adhesion and delamination.

According to a first aspect, the present invention provides a multi-layered piezoelectric ceramic-containing structure comprising:

a metal substrate;

a metallic adhesive layer on a surface of the metal substrate;

a non-metallic thermal barrier layer on the metallic adhesive layer; and a piezoelectric ceramic layer sandwiched between a first electrode layer and a second electrode layer, wherein the first electrode layer is on the non-metallic thermal barrier layer.

Figure 1:
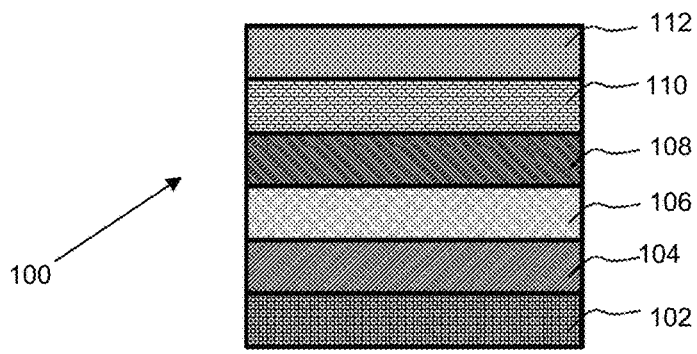
FIG. 1 shows a schematic representation of the cross-section of the multi-layered piezoelectric ceramic-containing structure according to one embodiment of the present invention.

A schematic representation of the multi-layered piezoelectric ceramic-containing structure is shown in FIG. 1.

FIG. 1 shows a multi-layered structure 100 comprising: a metal substrate 102; a metallic adhesive layer 104 on a surface of the metal substrate 102; a non-metallic thermal barrier layer 106 on the metallic adhesive layer 104, a first electrode layer 108 on the non-metallic thermal barrier layer 106, a piezoelectric ceramic layer 110 on the first electrode layer 108 and a second electrode layer 112 on the piezoelectric ceramic layer 110.

The metallic adhesive layer 104 and the non-metallic thermal barrier layer 106 form the intermediate layers between the substrate 102 and the piezoelectric ceramic layer 110. In particular, the intermediate layers comprising the metallic adhesive layer 104 and the non-metallic thermal barrier layer 106 enhance the adhesion of the adjacent layers on the substrate 102, protect the substrate 102 from corrosion, and/or act as a thermal barrier layer for achieving a high quality piezoelectric ceramic layer 110 on the metal substrate 102. In particular, the composition and thickness of the metallic adhesive layer 104 and the non-metallic thermal barrier layer 106 contribute to achieving a high quality piezoelectric ceramic layer 110 on the metal substrate 102.

Each of the layers will be described in more detail.

Substrate

The metal substrate 102 may be any suitable metal substrate. For the purposes of the present application, the term metal is defined to include metal and metal alloys. For example, the metal substrate may comprise a base metal. In particular, the metal substrate may comprise, but is not limited to, steel, aluminium, titanium, copper, or alloys comprising combinations thereof. Even more in particular, the substrate may be steel.

The substrate may be in any form. For example, the substrate may be in the form of a plate, rod, pipe, circular disk, with a flat or curved surface. According to a particular aspect, the substrate may be in the form of a flat plate. According to another particular aspect, the substrate may be in the form of a pipe.

According to a particular aspect, when the substrate 102 is a flat plate, the multi-layered structure 100 may be a flat structure.

According to a particular aspect, when the substrate 102 is a pipe, the multi-layered structure 100 may be a curved structure or a tube structure.

Metallic Adhesive Layer

The metal adhesive layer 104 may comprise a metallic material to enhance the adhesion of the adjacent layers and for protecting the substrate 102 against corrosion. For the purposes of the present application, the term metallic material is defined to include any metal or metal alloy. The metallic adhesive layer 104 may comprise, but is not limited to, titanium (Ti), nickel (Ni), platinum (Pt), ruthenium (Ru)- or Pt-based nickel aluminide alloy, or an alloy such as MCrAlY, wherein M is a metal selected from, but not limited to, nickel (Ni), iron (Fe), or cobalt (Co). In particular, the metallic adhesive layer 104 may be NiCrAlY alloy.

The metallic adhesive layer 104 may be of any suitable thickness. For example, the metallic adhesive layer 104 may have a thickness of ≥20 μm. In particular, the metallic adhesive layer 104 may have a thickness of 50-150 μm, 55-145 μm, 60-140 μm, 65-135 μm, 70-130 μm, 80-120 μm, 90-110 μm, 100-105 μm. Even more in particular, the metallic adhesive layer 104 may have a thickness of about 100 μm.

The metallic adhesive layer 104 may be formed by any suitable method. For example, the metallic adhesive layer 104 may be formed by thermal spraying.

Non-Metallic Thermal Barrier Layer

The non-metallic thermal barrier layer 106 may comprise a non-metallic material to act as a thermal barrier layer. In particular, the non-metallic thermal barrier layer 106 may comprise an oxide, preferably an inorganic oxide. For example, the non-metallic thermal barrier layer 106 may comprise, but not limited to, yttria-stabilized zirconia (YSZ), alumina, rare-earth oxides, rare-earth zirconates, or a combination thereof. Even more in particular, the non-metallic thermal barrier layer 106 may comprise YSZ.

The non-metallic thermal barrier layer 106 may be of any suitable thickness. For example, the non-metallic thermal barrier layer 106 may have a thickness of ≥20 μm. In particular, the non-metallic thermal barrier layer 106 may have a thickness of 100-500 μm, 125-475 μm, 150-450 μm, 175-425 μm, 200-400 μm, 225-375 μm, 250-350 μm, 275-325 μm. 300-310 μm. Even more in particular, the non-metallic thermal barrier layer 106 may have a thickness of about 300 μm.

The non-metallic thermal barrier layer 106 may be formed by any suitable method. For example, the non-metallic thermal barrier layer 106 may be formed by thermal spraying.

First Electrode Layer 108 and Second Electrode Layer 112

The first electrode layer 108 may be provided on the non-metallic thermal barrier layer 106, while the second electrode layer 112 may be provided on the piezoelectric ceramic layer 110.

The first electrode layer 108 and the second electrode layer 112 may comprise any suitable metal or conductive oxide. For example, the metal may be, but not limited to, platinum (Pt), silver (Ag), palladium (Pd), gold (Au), rhodium (Rh), ruthenium (Ru), or alloys comprising combinations of metals thereof. In particular, the metal may be Ag or a Pd/Ag alloy. According to a particular aspect, the Pd/Ag alloy may comprise 30 wt % Pd and 70 wt % Ag based on the total weight of the alloy.

The conductive oxide may be, but not limited to, $LaNiO_3$, $La_{0.5}Sr_{0.5}CoO_3$, $La_{0.7}Sr_{0.3}MnO_3$, or a combination thereof.

The first electrode layer 108 and the second electrode layer 112 may be the same or different from each other. The first electrode layer 108 and the second electrode layer 112 may each comprise a metal or conductive oxide. In particular, the first electrode layer 108 may comprise Pd/Ag and the second electrode layer 112 may comprise Ag.

The first electrode layer 108 and the second electrode layer 112 may have a suitable thickness. For example, each of the first electrode layer 108 and the second electrode layer 112 may have a thickness of ≥2 μm.

In particular, the first electrode layer 108 may have a thickness of 5-30 μm. Even more in particular, the first electrode layer 108 may have a thickness of 10-15 μm.

In particular, the second electrode layer 112 may have a thickness of 2-10 μm. Even more in particular, the second electrode layer 112 may have a thickness of 3-5 μm.

Piezoelectric Ceramic Layer

The piezoelectric ceramic layer 110 may comprise any suitable piezoelectric material.

For example, the piezoelectric ceramic layer 110 may comprise a piezoelectric oxide ceramic material. In particular, the piezoelectric ceramic layer 110 may be a lead-free piezoelectric ceramic layer, wherein the piezoelectric ceramic layer 110 may comprise a lead-free piezoelectric ceramic material. For example, the piezoelectric ceramic layer 110 may comprise, but is not limited to, a sodium potassium niobate (KNN)-based or bismuth sodium titanate (BNT)-based material. According to a particular aspect, the piezoelectric ceramic layer 110 may comprise a KNN-based piezoelectric material. Even more in particular, the piezoelectric ceramic layer 110 may comprise $(K_{0.44}Na_{0.52}Li_{0.04})(Nb_{0.84}Ta_{0.10}Sb_{0.06})O_3$.

The piezoelectric ceramic layer 110 may have a suitable thickness. For example, the piezoelectric ceramic layer 110 may have a thickness of ≥20 μm. In particular, the piezoelectric ceramic layer 110 may have a thickness of 50-300 μm, 75-275 μm. 100-250 μm, 125-225 μm, 150-200 μm, 175-180 μm. Even more in particular, the piezoelectric ceramic layer 110 may have a thickness of about 150 μm.

The deposited piezoelectric ceramic layer 110 may exhibit suitable piezoelectric performance. For example, the piezoelectric ceramic layer 110 may have an effective piezoelectric coefficient ($d_{33}$) of 50-130 pm/V. In particular, the effective piezoelectric coefficient ($d_{33}$) may be 55-125 pm/V, 60-120 pm/V, 65-115 pm/V, 70-110 pm/V, 75-105 pm/V, 80-100 pm/V, 85-95 pm/V, 87-90 pm/V. Even more in particular, piezoelectric ceramic layer 110 may have a d33 of 90-120 pm/V.

The piezoelectric ceramic layer 110 may be formed by any suitable method. For example, the piezoelectric ceramic layer 110 may be formed by thermal spraying.

The multi-layered structure 100 may be suitable for use in various applications. For example, the multi-layered structure 100 may be used in, but not limited to, structural health monitoring, particularly for steel-based engineering structures such as for aircrafts, ships, automobiles, trains, rails, various metallic infrastructures and industry machines.

According to a second aspect, the present invention provides a method of forming the multi-layered piezoelectric ceramic-containing structure described above, the method comprising:
providing a metal substrate;
depositing a metallic adhesive layer on a surface of the metal substrate;
depositing a non-metallic thermal barrier layer on the metallic adhesive layer;
depositing a first electrode layer on the non-metallic thermal barrier layer;
depositing a piezoelectric ceramic layer on the first electrode layer; and
depositing a second electrode layer on the piezoelectric ceramic layer.

The metal substrate may be as described above. According to a particular aspect, the method may further comprise cleaning, and optionally roughening, the surface of the metal substrate onto which the metallic adhesive layer is to be deposited prior to the depositing a metallic adhesive layer on a surface of the metal substrate. The cleaning, and optionally roughening may comprise any suitable method of cleaning and roughening the surface of the substrate, respectively. In particular, the cleaning, and optionally roughening, may comprise sandblasting the surface of the metal substrate by ceramic particles, such as alumina particles. Cleaning, and optionally roughening, may provide better adhesion of the metallic adhesive layer to the surface of the metal substrate.

The depositing a metallic adhesive layer, the depositing a non-metallic thermal barrier layer and the depositing a piezoelectric ceramic layer may comprise any suitable depositing method. According to a particular aspect, the depositing a metallic adhesive layer, the depositing a non-metallic thermal barrier layer and/or the depositing a piezoelectric ceramic layer may comprise thermal spraying. The thermal spraying may comprise any suitable thermal spraying method including, but not limited to: atmospheric plasma spraying (APS), low pressure plasma spraying (LPPS), vacuum plasma spraying (VPS), high velocity oxygen fuel (HVOF), or a combination thereof.

In particular, the depositing a metallic adhesive layer and the depositing a non-metallic thermal barrier layer may be by APS. Even more in particular, the APS may be by using a gas stabilised plasma gun.

The depositing a first electrode layer on the non-metallic thermal barrier layer may be by any suitable depositing method. For example, the depositing may be by brushing, spray coating, screen printing, inkjet printing, dip coating, or a combination thereof. In particular, the depositing may be by painting an ink comprising the material comprised in the first electrode layer with a brush.

The method may further comprise heat treating the first electrode layer prior to the depositing a piezoelectric ceramic layer. The heat treating may be under suitable conditions. For example, the heat treating may comprise heat treating the first electrode layer at a pre-determined temperature. The pre-determined temperature may be any suitable temperature. For example, the pre-determined temperature may be 950-1100° C.

The method may further comprise preparing a precursor mixture of piezoelectric ceramic material prior to the depositing a piezoelectric ceramic layer on the first electrode layer. The precursor mixture may be prepared by any suitable method. According to a particular aspect, the precursor mixture may be formed into a suitable particle size for use in the depositing a piezoelectric ceramic layer. In particular, the preparing may comprise preparing the precursor mixture into a suitable particle size for use in the depositing a piezoelectric ceramic layer by thermal spraying. The thermal spraying may be as described above. In particular, the thermal spraying may comprise APS.

In order to improve the crystallinity of the piezoelectric ceramic layer, the method may further comprise heat treating the piezoelectric ceramic layer prior to the depositing a second electrode layer. The heat treating may be under suitable conditions. For example, the heat treating may comprise heat treating the piezoelectric ceramic layer at a pre-determined temperature. The pre-determined temperature may be any suitable temperature. For example, the pre-determined temperature may be 950-1100° C. The heat treating may be by any suitable method. For example, the heat treating may be by, but not limited to, a flame at the pre-determined temperature.

The depositing a second electrode layer on the piezoelectric ceramic layer may be by any suitable depositing method. For example, the depositing may be by brushing, spray coating, screen printing, inkjet printing, dip coating, or a combination. In particular, the depositing may be by painting an ink comprising the material comprised in the second electrode layer with a brush.

The method may further comprise heat treating the second electrode layer. The heat treating may be under suitable conditions. For example, the heat treating may comprise heat treating the second electrode layer at a pre-determined temperature. The pre-determined temperature may be any suitable temperature. For example, the pre-determined temperature may be 80-750° C.

The method of the present invention provides a suitable method for directly forming ultrasonic transducers on metallic structures compared to using handheld ultrasonic transducers or manually installed discrete devices. The method further provides a suitable method which is robust with all inorganic metallic and ceramic structures for applications at elevated temperatures in a harsh environment. In particular, the method is applicable for large area applications as well as able to exhibit strong electromechanical coupling from the piezoelectric ceramic layer with suitable thickness and enhanced performance properties.

Having now generally described the invention, the same will be more readily understood through reference to the following embodiment which is provided by way of illustration, and is not intended to be limiting.

EXAMPLE

Figure 2:
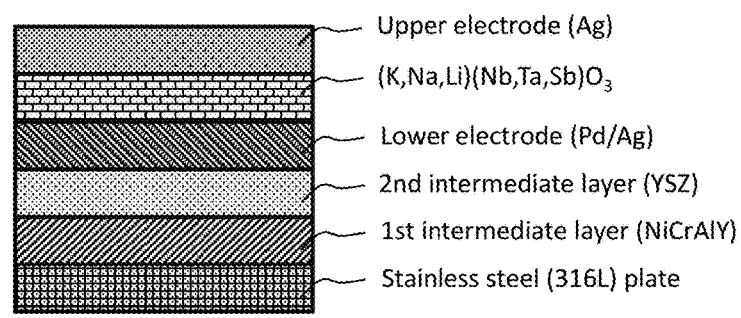
FIG. 2 shows a schematic representation of the cross-section of the multi-layered piezoelectric ceramic-containing structure according to one embodiment of the present invention.

Example 1—Preparation of Multi-Layered Piezoelectric Ceramic-Containing Structure A multi-layered structure comprising a stainless steel (316L) flat plate, a metallic adhesion layer made of NiCrAlY alloy, a non-metallic thermal barrier layer made of YSZ (with 8 mol % $Y_2O_3$), a first electrode made of Pd/Ag (30/70 wt %), a lead-free piezoelectric ceramic layer with a composition of $(K_{0.44}Na_{0.52}Li_{0.04})(Nb_{0.84}Ta_{0.10}Sb_{0.06})O_3$ ((K,Na,Li)(Nb,Ta,Sb)$O_3$), and a second electrode made of Ag is formed. A schematic representation of the cross-sectional view of the multi-layered structure formed is as shown in FIG. 2.

The multi-layered structure was formed as follows. Stainless steel plates were sandblasted by alumina particles in order to provide good adhesion with the metallic adhesive layer. The metallic adhesive layer made of NiCrAlY alloy with a thickness of about 100 μm was deposited on the steel substrates by plasma spray technique, from NiCrAlY feedstock powder with a particle size range 45-75 μm. The alloy composition was Ni-22% Cr-10% Al-1% Y.

The non-metallic thermal barrier layer made of YSZ ($ZrO_2$ with 8 mol % $Y_2O_3$) with a thickness of 300 μm was deposited by thermal spray on the metallic adhesive layer, from YSZ feedstock powder with a particle size range 11-125 μm used in the spraying process. Both feedstock materials were deposited with atmospheric plasma spray technique, in which a gas stabilized plasma gun was used.

The first electrode layer made of Pd/Ag (30/70 wt %) was then deposited on the non-metallic thermal barrier layer by painting Pd/Ag ink with a brush, followed by a thermal treatment at 30° C./min to 1100° C. for 10 minutes.

To deposit the piezoelectric ceramic layer with the composition of $(K,Na,Li)(Nb,Ta,Sb)O_3$, $K_2CO_3$ (99.5%), $Na_2CO_3$ (99.0%), $Li_2CO_3$ (99.999%), $Nb_2O_5$ (99.9%), $Ta_2O_5$ (99.85%), and $Sb_2O_5$ (99.998%) powders were used as the starting materials with stoichiometric composition of $(K_{0.44}Na_{0.52}Li_{0.04})(Nb_{0.84}Ta_{0.10}Sb_{0.06})O_3$ plus 10 mol % excess K and Na. The weighed materials were mixed with ethanol and zirconia balls in a planetary ball mill for 24 hours. The slurry was then dried in an oven, crushed using an agate mortar and pestle, and calcined at 850° C. for 5 hours in an alumina crucible to form $(K,Na,Li)(Nb,Ta,Sb)O_3$ perovskite phase. The calcined powder was crushed, compacted, and calcined at 1000° C. for 5 hours in an alumina crucible, in order to achieve the desired particle size for subsequent plasma spray deposition process. The resulting powder was introduced into to an atmospheric plasma spraying system, and $(K,Na,Li)(Nb,Ta,Sb)O_3$ layer with a thickness of about 150 μm was deposited on the stainless steel plate at ambient pressure using Ar plasma with plasma power of 17 kW, feeding rate of 20 g/min, and torch-substrate distance of 75 mm. In order to improve the crystallinity of the thermal sprayed $(K,Na,Li)(Nb,Ta,Sb)O_3$ layer, a post-spray heat treatment was conducted in an oven at 1100° C. for 30 minutes, with a ramping rate of 30° C./min.

Finally, patterned Ag upper electrodes were deposited on the $(K,Na,Li)(Nb,Ta,Sb)O_3$ layer by painting using a brush with the aid of a shadow mask, followed with firing at 520° C. for 15 minutes.

Figure 3:
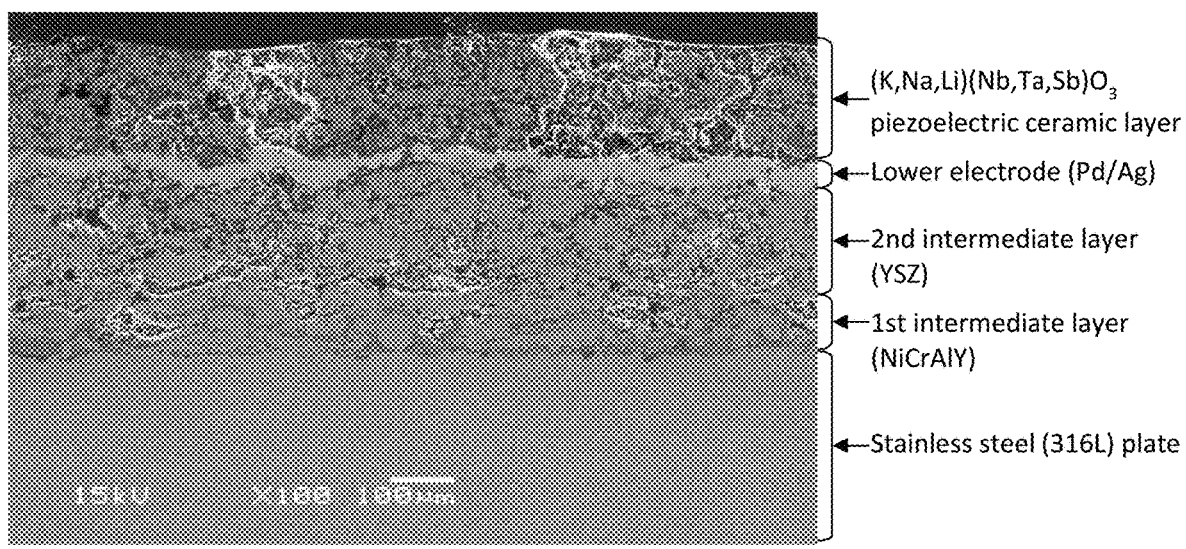
FIG. 3 shows the scanning electron microscopy (SEM) image of the cross-sectional morphology of the multi-layered structure of FIG. 2.

FIG. 3 presents a typical cross-sectional morphology of the multi-layered structure inspected with scanning electron microscopy (SEM). The multi-layered structure exhibited strong adhesion without crack or delamination between the layers.

Figure 4:
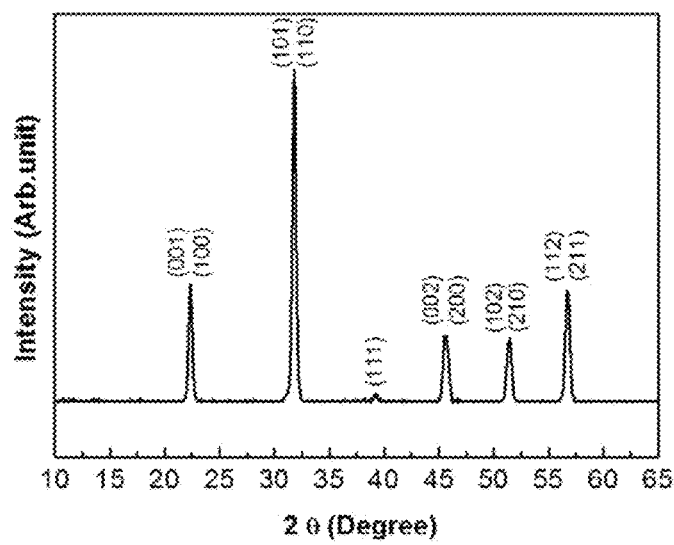
FIG. 4 shows the x-ray diffraction (XRD) pattern of the multi-layered structure of FIG. 2.

FIG. 4 shows the x-ray diffraction (XRD) pattern of the $(K,Na,Li)(Nb,Ta,Sb)O_3$ ceramic layer obtained on the stainless steel (316L) plate. The layer exhibited a single phase of perovskite structure, without any secondary phase detected.

Figure 5:
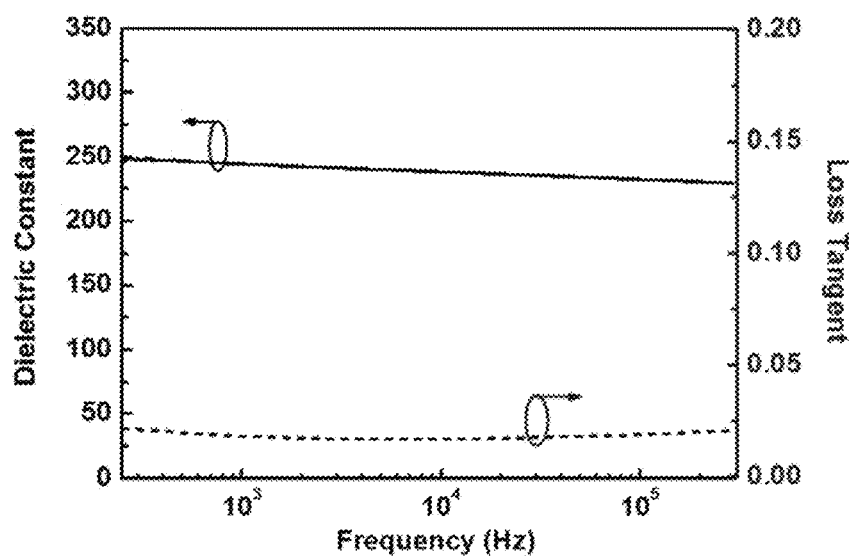
FIG. 5 shows the dielectric properties of the multi-layered structure of FIG. 2.

The $(K,Na,Li)(Nb,Ta,Sb)O_3$ ceramic layer exhibited a high dielectric constant of 246 and a low dielectric loss of 1.8%, measured at 1 kHz and room temperature, as shown in FIG. 5.

Figure 6:
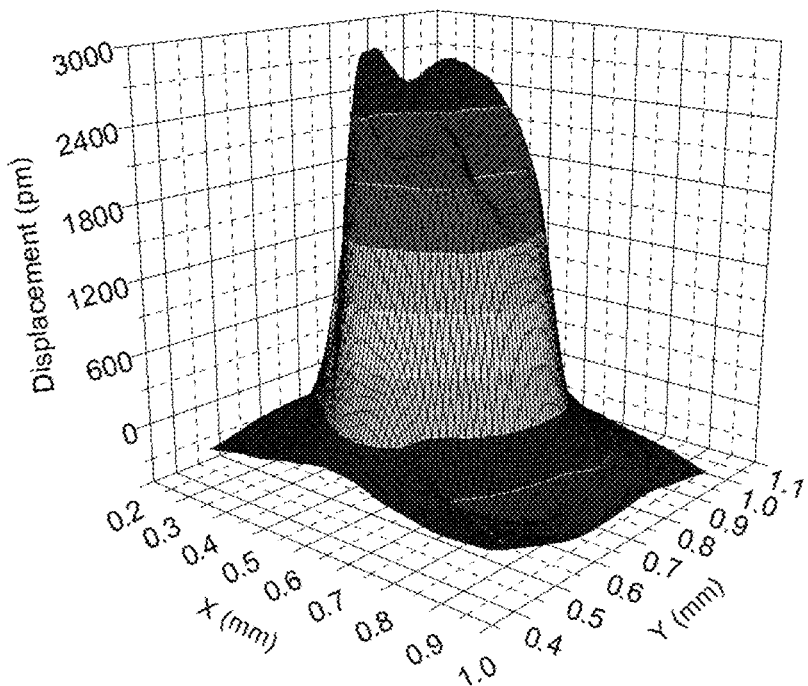
FIG. 6 shows a three-dimensional drawing of the vibration data of the piezoelectric ceramic layer of the multi-layered structure of FIG. 2 under an electric sine wave driving.

To study piezoelectric properties, the obtained $(K,Na,Li)(Nb,Ta,Sb)O_3$ ceramic layer was poled at 120° C. under an electric field of 35 kV/cm. The effective piezoelectric coefficient ($d_{33}$) was measured using a laser scanning vibrometer, under the condition with the substrate's mechanical clamping. FIG. 6 shows the three-dimensional drawing of the instantaneous vibration data of the $(K,Na,Li)(Nb,Ta,Sb)O_3$ layer under the electric sine wave driving. During the testing, a unipolar AC signal of 20 V amplitude at 1 kHz was applied to the sample. The effective piezoelectric coefficient ($d_{33}$) was determined as 125 pm/V, under the substrate clamping effect.

Example 2—Comparative Example

A multi-layered structure with the same substrate, piezoelectric ceramic and second electrode layers as Example 1, but without the first electrode layer, the metallic adhesive layer and the non-metallic thermal barrier layer, is schematically illustrated in FIG. 7(a). Another multi-layered structure with the layers as Example 1 but only without the intermediate layers, i.e. the metallic adhesive layer and the non-metallic thermal barrier layer is schematically shown in FIG. 7(b).

Figure 7:
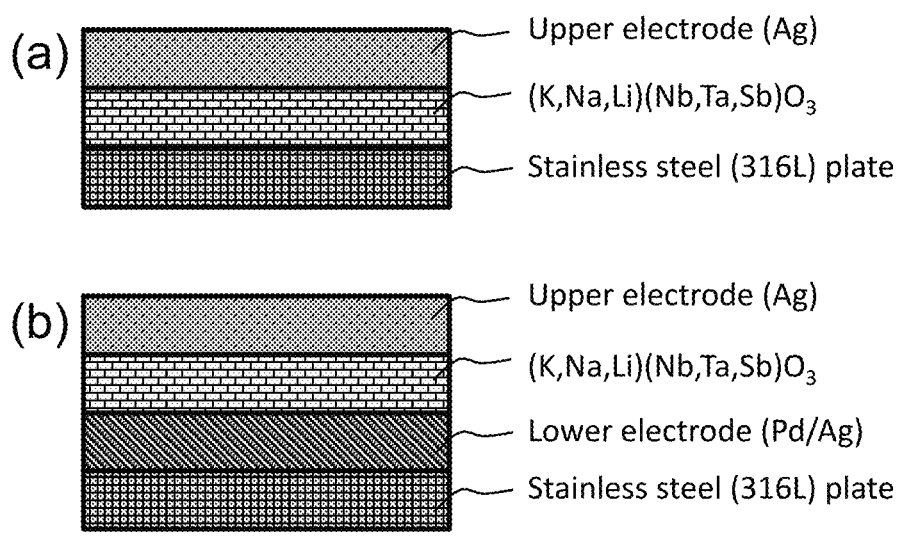
FIG. 7(a) shows a schematic representation of the cross-section of a multi-layered piezoelectric ceramic-containing structure without a metal adhesive layer, a non-metallic thermal barrier layer and a first electrode layer.
FIG. 7(b) shows a schematic representation of the cross-section of a multi-layered piezoelectric ceramic-containing structure without a metal adhesive layer and a non-metallic thermal barrier layer.
Figure 8:
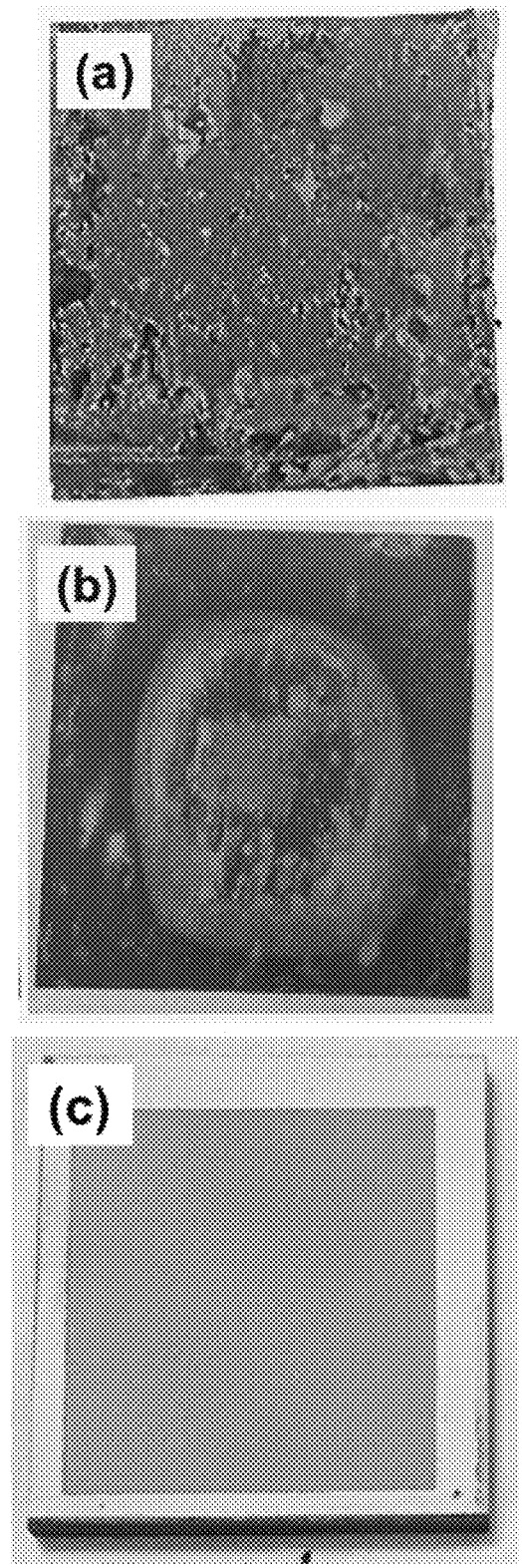
FIG. 8(a) shows the substrate of the multi-layered structure of FIG. 7(a) following heat treatment.
FIG. 8(b) shows the substrate of the multi-layered structure of FIG. 7(b) following heat treatment.
FIG. 8(c) shows the substrate of the multi-layered structure of FIG. 2 following heat treatment.

Experimental results showed that, without the intermediate layers (i.e. the metallic adhesive layer and the non-metallic thermal barrier layer) as disclosed in Example 1, it was not feasible to obtain the two structures as illustrated in FIG. 7. As revealed in FIG. 8(a), the stainless steel (316L) substrate after heat treatment at 900° C. in air was seriously oxidized and corroded at the high temperature. For the structure of stainless steel (316L) plate with the Pd/Ag lower electrode layer, the heat treatment resulted in delamination of most of the lower electrode layer due to the significant oxidation and corrosion of the steel, as shown in FIG. 8(b). The piezoelectric ceramic layer required a heat treatment substantially higher than 900° C. in air. As a result, it was not realistic to produce the two piezoelectric ceramic structures directly on the stainless substrate with practical utility as illustrated in FIGS. 7(a) and 7(b).

In contrast, the multi-layered structure as described in Example 1 exhibited structural integrity after heat treatment at 1100° C., as shown in FIG. 8(c). These results indicate the crucial role of the intermediate layer comprising the metallic adhesive layer and the non-metallic thermal barrier layer for enabling the feasibility of practical fabrication of a piezoelectric ceramic thick layer on a stainless steel substrate. In particular, the metallic adhesive layer provides oxidation and corrosion protection to the metal plate during the high-temperature thermal treatment in air as required for processing the piezoelectric ceramic thick layer, and the non-metallic thermal barrier layer acts as a thermal barrier layer to protect the metal plate from exposure to high temperature during the thermal spray process.

Figure 9:
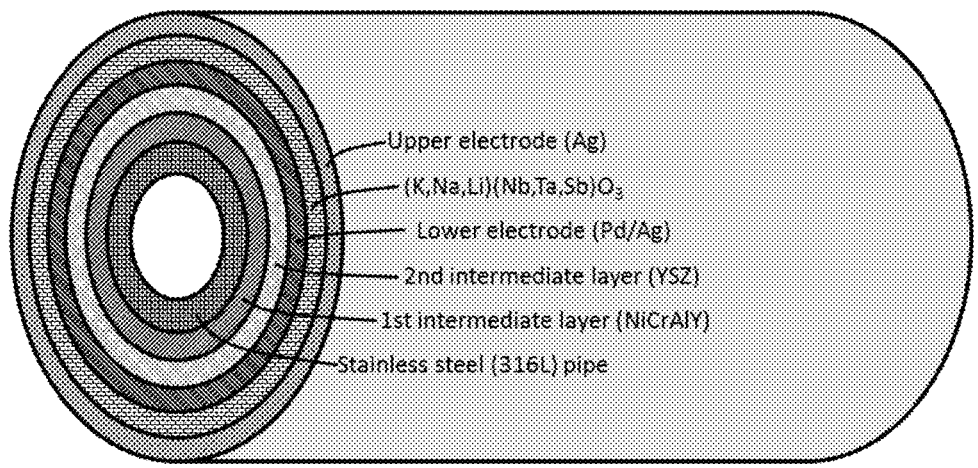
FIG. 9 shows schematic representation of the cross-section of a multi-layered piezoelectric ceramic-containing structure on a metal pipe as the substrate.

Example 3—Preparation of Multi-Layered Piezoelectric Ceramic-Containing Structure on a Pipe FIG. 9 illustrates a cross-sectional view of a multi-layered structure according to a preferred embodiment, wherein the metal substrate is a stainless steel (316L) pipe. The multi-layered structure comprised a stainless steel (316L) pipe, a metallic adhesive layer made of NiCrAlY alloy, a non-metallic thermal barrier layer made of YSZ ($ZrO_2$ with 8 mol % $Y_2O_3$), a first electrode layer comprising Pd/Ag, a lead-free piezoelectric ceramic layer with a composition of $(K_{0.44}Na_{0.52}Li_{0.04})(Nb_{0.84}Ta_{0.10}Sb_{0.06})O_3$ ($(K,Na,Li)(Nb,Ta,Sb)O_3$), and a second electrode layer comprising Ag.

The multilayer structure was produced by a processing method as described in Example 1, but with different heat treatment conditions. It was found that the heat treatment conditions for the first electrode layer and the $(K,Na,Li)(Nb,$ Ta,Sb)O$_3$ piezoelectric ceramic layer were critical in achieving the integrity for the multi-layered tube structure. The Pd/Ag (30/70) first electrode layer was heat-treated in an oven at a faster ramp rate of 100° C./min to a lower temperature of 950° C. for a shorter duration of 10 minutes.

After deposition of the (K,Na,Li)(Nb,Ta,Sb)O$_3$ piezoelectric ceramic layer with a thickness of 120 μm by thermal spray, post-spray heat treatments were conducted in an oven also with the faster ramp rate of 100° C./min to a lower temperature of 950° C. for a shorter duration of 10 minutes.

The heat treatment conditions as described above in this example achieved the structural integrity wherein the metal substrate was a stainless steel pipe. Using the same heat treatment conditions as described in Example 1 for a flat structured substrate resulted in failure in the multi-layered structure on the stainless pipe structure in the form of cracks and delamination.

Figure 10:
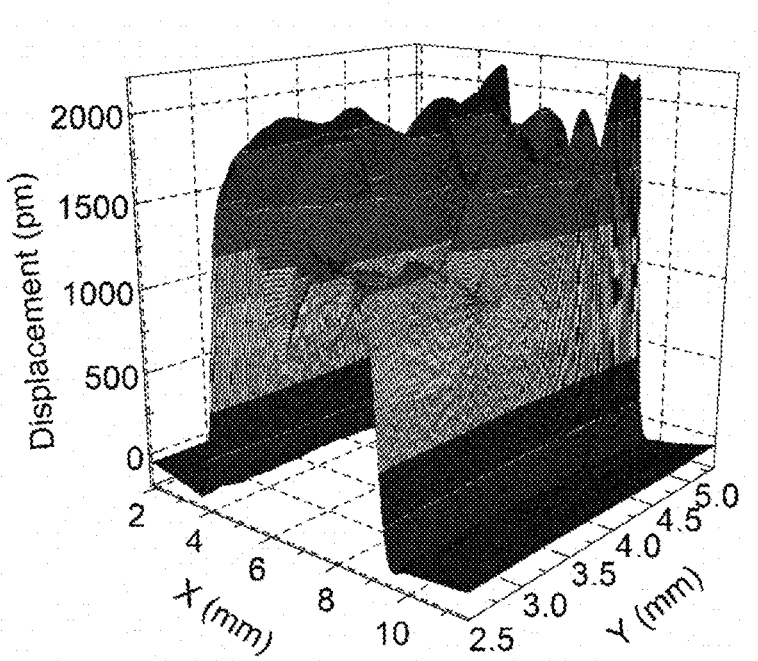
FIG. 10 shows the three-dimensional drawing of the vibration data of the piezoelectric ceramic layer of the multi-layered structure of FIG. 9 under an electric sine wave driving.

To study piezoelectric properties, the (K,Na,Li)(Nb,Ta,Sb)O$_3$ layer was poled at room temperature for 10 minutes under an electric field of 30 kV/cm. The piezoelectric coefficient ($d_{33}$) was measured using a laser scanning vibrometer. FIG. 10 presents the three-dimensional drawing of the instantaneous vibration data of the (K,Na,Li)(Nb,Ta,Sb)O$_3$ ceramic layer produced on the stainless steel pipe structure under an electric sine wave driving, with 20 V amplitude at 1 kHz. The effective piezoelectric coefficient ($d_{33}$) was determined as 90 pm/V, under the substrate clamping effect.

Example 4—Variation in Preparation of Multi-Layered Piezoelectric Ceramic-Containing Structure on a Pipe The multi-layered structure on the stainless steel pipe was produced by the same processing method as described in Example 3, except that the piezoelectric ceramic layer comprising (K,Na,Li)(Nb,Ta,Sb)O$_3$ was heat-treated by a flame from a butane blowtorch instead of thermal treatment in an oven.

Instead of a flame from a butane blowtorch, an electromagnetic irradiation (such as laser, infrared) or a flame from any other fuel blowtorch may also be used.

The heat treatment of the piezoelectric ceramic layer comprising (K,Na,Li)(Nb,Ta,Sb)O$_3$ was carried out for 8 minutes in air. The temperature reached 1102° C. The sample, after flame annealing for 8 minutes, exhibited solid structural integrity without cracking or delamination. Thus, fast annealing using flame blowtorch may produce the piezoelectric ceramic coating without cracking or delaminating on stainless steel pipe at least up to 1100° C.

Figure 11:
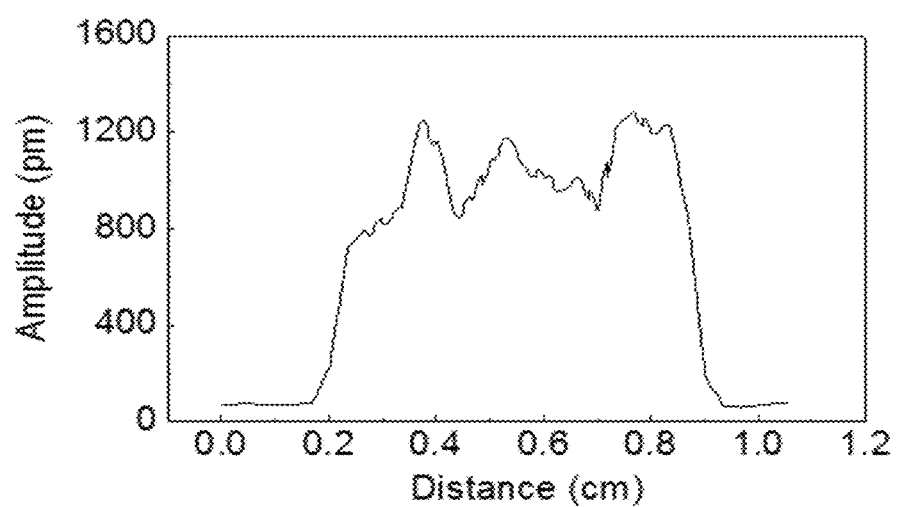
FIG. 11 shows a two-dimensional drawing of the vibration of the piezoelectric ceramic layer of the multi-layered structure of FIG. 9 after annealing with flame, under an electric driving.

For piezoelectric testing, a Ag electrode was deposited on the piezoelectric ceramic layer comprising (K,Na,Li)(Nb,Ta,Sb)O$_3$ as the second electrode layer. After the piezoelectric ceramic layer was poled at room temperature under an electric field of 25 kV/cm for 10 minutes, the effective piezoelectric coefficient ($d_{33}$) was measured using a laser scanning vibrometer, under the conditions with the substrate's mechanical clamping. FIG. 11 shows a two-dimensional drawing of the instantaneous vibration data of the piezoelectric ceramic layer comprising (K,Na,Li)(Nb,Ta,Sb)O$_3$ under the electric sine wave driving, with a unipolar AC signal of 20 V at 1 kHz. The effective piezoelectric coefficient ($d_{33}$) was determined as 60 pm/V, under the substrate clamping effect.

Whilst the foregoing description has described exemplary embodiments, it will be understood by those skilled in the technology concerned that many variations may be made without departing from the present invention.

The invention claimed is:

1. A multi-layered piezoelectric ceramic-containing structure comprising:
    a metal substrate;
    a metallic adhesive layer on a surface of the metal substrate;
    a non-metallic thermal barrier layer on the metallic adhesive layer; and
    a piezoelectric ceramic layer sandwiched between a first electrode layer and a second electrode layer, wherein the first electrode layer is on the non-metallic thermal barrier layer, wherein each of the metallic adhesive layer and the non-metallic thermal barrier layer has a thickness of ≥20 μm.

2. The structure according to claim 1, wherein the piezoelectric ceramic layer is a lead-free piezoelectric ceramic layer.

3. The structure according to claim 1, wherein the piezoelectric ceramic layer is a sodium potassium niobate-based or bismuth sodium titanate-based layer.

4. The structure according to claim 1, wherein the substrate comprises a base metal.

5. The structure according to claim 4, wherein the substrate is steel.

6. The structure according to claim 1, wherein the metallic adhesive layer comprises a metal or metal alloy.

7. The structure according to claim 6, wherein the metallic adhesive layer comprises NiCrAlY alloy.

8. The structure according to claim 1, wherein the non-metallic thermal barrier layer comprises an inorganic oxide.

9. The structure according to claim 8, wherein the non-metallic thermal barrier layer comprises yttria-stabilised zirconia (YSZ).

10. The structure according to claim 1, wherein the piezoelectric ceramic layer has a thickness of ≥20 μm.

11. The structure according to claim 1, wherein the non-metallic thermal barrier layer has a thickness of 100-500 μm.

12. The structure according to claim 1, wherein each of the first electrode layer and the second electrode layer has a thickness of ≥2 μm.

13. The structure according to claim 1, wherein the piezoelectric ceramic layer is formed by thermal spraying.

14. The structure according to claim 1, wherein each of the metallic adhesive layer and the non-metallic thermal barrier layer is formed by thermal spraying.

15. The structure according to claim 1, wherein the piezoelectric ceramic layer has an effective piezoelectric coefficient ($d_{33}$) of 50-130 pm/V.

16. A method of forming the multi-layered piezoelectric ceramic-containing structure according to claim 1, the method comprising:
    providing a metal substrate;
    depositing a metallic adhesive layer on a surface of the metal substrate;
    depositing a non-metallic thermal barrier layer on the metallic adhesive layer;
    depositing a first electrode layer on the non-metallic thermal barrier layer;
    depositing a piezoelectric ceramic layer on the first electrode layer; and
    depositing a second electrode layer on the piezoelectric ceramic layer.

17. The method according to claim 16, wherein the depositing a metallic adhesive layer, the depositing a non-metallic thermal barrier layer and the depositing a piezoelectric ceramic layer comprises thermal spraying.

18. The method according to claim 16, wherein the method further comprises heat treating the piezoelectric ceramic layer at a pre-determined temperature prior to the depositing a second electrode layer.

19. The method according to claim 18, wherein the heat treating comprises heat treating the piezoelectric ceramic layer with a flame at the pre-determined temperature.

20. A multi-layered piezoelectric ceramic-containing structure comprising:
- a metal substrate;
- a metallic adhesive layer on a surface of the metal substrate;
- a non-metallic thermal barrier layer on the metallic adhesive layer, the non-metallic thermal barrier layer having a thickness of 100-500 μm; and
- a piezoelectric ceramic layer sandwiched between a first electrode layer and a second electrode layer, wherein the first electrode layer is on the non-metallic thermal barrier layer.

* * * * *